(12) United States Patent
Li

(10) Patent No.: US 10,522,770 B2
(45) Date of Patent: Dec. 31, 2019

(54) FABRICATING METHOD OF FLEXIVLE PANEL AND FLEXIBLE DISPLAY DEVICE

(71) Applicant: Wuhan China Star Optoelectronics Semiconductor Display Technology Co., Ltd., Wuhan, Hubei (CN)

(72) Inventor: Chao Li, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/909,808

(22) Filed: Mar. 1, 2018

(65) Prior Publication Data
US 2019/0207129 A1 Jul. 4, 2019

Related U.S. Application Data
(63) Continuation of application No. PCT/CN2018/072977, filed on Jan. 17, 2018.

(30) Foreign Application Priority Data

Dec. 28, 2017 (CN) .......................... 2017 1 1470800

(51) Int. Cl.
*H01L 51/00* (2006.01)
*H01L 51/52* (2006.01)
(Continued)

(52) U.S. Cl.
CPC ...... *H01L 51/0097* (2013.01); *H01L 27/3262* (2013.01); *H01L 27/3274* (2013.01);
(Continued)

(58) Field of Classification Search
None
See application file for complete search history.

(56) References Cited

U.S. PATENT DOCUMENTS

2013/0071650 A1 3/2013 Liu et al.
2017/0092885 A1 3/2017 Sakuishi et al.
(Continued)

FOREIGN PATENT DOCUMENTS

CN 105511140 A 4/2016
CN 105632347 A 6/2016
(Continued)

*Primary Examiner* — Jack S Chen
(74) *Attorney, Agent, or Firm* — Hemisphere Law, PLLC; Zhigang Ma

(57) ABSTRACT

The present invention discloses a fabricating method of a flexible panel and a flexible display device. The method includes: forming a protective layer on a glass substrate, forming a flexible material layer on the protective layer, sequentially forming a thin film transistor on the flexible material layer, and forming an organic functional layer and the encapsulating layer to form a flexible panel; and separating the glass substrate and the flexible material layer by laser stripping to obtain the flexible panel. By the above method, the glass substrate and the flexible material can be fully peeled off, reducing the defect rate of peeling of the flexible material, optical characteristics of the display.

11 Claims, 4 Drawing Sheets

(51) Int. Cl.
  *H01L 27/32* (2006.01)
  *H01L 51/05* (2006.01)
  *H01L 51/56* (2006.01)

(52) U.S. Cl.
  CPC ...... *H01L 51/0545* (2013.01); *H01L 51/5253* (2013.01); *H01L 51/56* (2013.01)

(56) References Cited

U.S. PATENT DOCUMENTS

2017/0162825 A1\* 6/2017 Xiao .................. H01L 27/3244
2017/0207402 A1   7/2017 Cheng et al.
2018/0219164 A1   8/2018 Xu

FOREIGN PATENT DOCUMENTS

| CN | 106711348 A | 5/2017 |
| CN | 107482022 A | 12/2017 |
| CN | 107507929 A | 12/2017 |
| CN | 107845741 A | 3/2018 |

\* cited by examiner

FABRICATING METHOD OF FLEXIVLE PANEL AND FLEXIBLE DISPLAY DEVICE

RELATED APPLICATIONS

The present application is a National Phase of International Application Number PCT/CN2018/072977, filed Jan. 17, 2018, and claims the priority of China Application 201711470800.X, filed Dec. 28, 2017.

FIELD OF THE DISCLOSURE

The present invention relates to the field of flexible display technology and involves with a fabricating method of a flexible panel and a flexible display device particularly.

BACKGROUND

With the development of display technology, flexible display devices are widely used. Wherein the array substrate of the flexible display device must be a flexible substrate. Since the flexible substrate is easily deformed. So, during the fabricating of the display substrate, it is necessary to form a flexible material layer on the glass substrate, and then sequentially form various kinds of display structure on the flexible material layer, such as a thin film transistor, a data line, a gate line, a capacitor, a positive/negative electrode and an organic light emitting layer, and then peel off the glass substrate and the flexible material layer to form an independent flexible display substrate.

During long-term research and development, the inventor of the present application found that during the fabricating of the substrate, the cleaning of the glass substrate does not completely wash away the particulate matter on the glass substrate, so that the glass substrate and the flexible material layer cannot be completely peeled off, affecting the flexibility of the flexible material. The success rate of layer delamination also affects the optical characteristics of the flexible display device.

INVENTION CONTENT

The main technical problem to be solved of the present invention is to provide a fabricating method of a flexible panel and a flexible display device, which can completely peel off the glass substrate and the flexible material, reduce the defect rate of peeling of the flexible material and improve the optical characteristics of the flexible display.

In order to solve the above technical problem, the present invention adopted a technical solution is to provide a fabricating method of a flexible panel. The method includes: forming a protective layer on a glass substrate; forming a flexible material layer on the protective layer; sequentially forming a thin film transistor, an organic functional layer and an encapsulating layer on the flexible material layer to form a flexible panel; and separating the glass substrate from the flexible material layer by laser stripping to obtain a flexible panel.

In order to solve the above technical problem, another technical solution adopted by the present invention is to provide a flexible display device, which comprises the flexible panel prepared by any one of the above methods.

The beneficial effect of the present invention is that by adding a protective layer between the glass substrate and the flexible material layer, the particulate material on the glass substrate does not directly affect the flexible material layer, and when the glass substrate and the flexible material layer are peeled off, get a complete flexible panel, reduce the rate of defective stripping flexible materials, while promote the optical properties of the flexible display.

BRIEF DESCRIPTION OF THE DRAWINGS

FIG. 1 is a schematic flow chart of a first embodiment of a flexible panel fabricating method that the present invention based on;

FIG. 2 is a schematic structural view of a first embodiment of a flexible panel fabricating method that the present invention based on;

FIG. 3 is a schematic flow chart of a second embodiment of a flexible panel fabricating method that the present invention based on;

FIG. 4 is a schematic structural view of a second embodiment of a flexible panel fabricating method that the present invention based on;

FIG. 5 is a schematic flow chart of a first embodiment of a flexible panel fabricating method that the present invention based on;

FIG. 6 is a schematic structural view of a second embodiment of a flexible panel fabricating method that the present invention based on;

DETAILED DESCRIPTION OF PREFERRED EMBODIMENTS

The present invention is described in detail below with reference to the accompanying drawings and embodiments.

Figure 1:
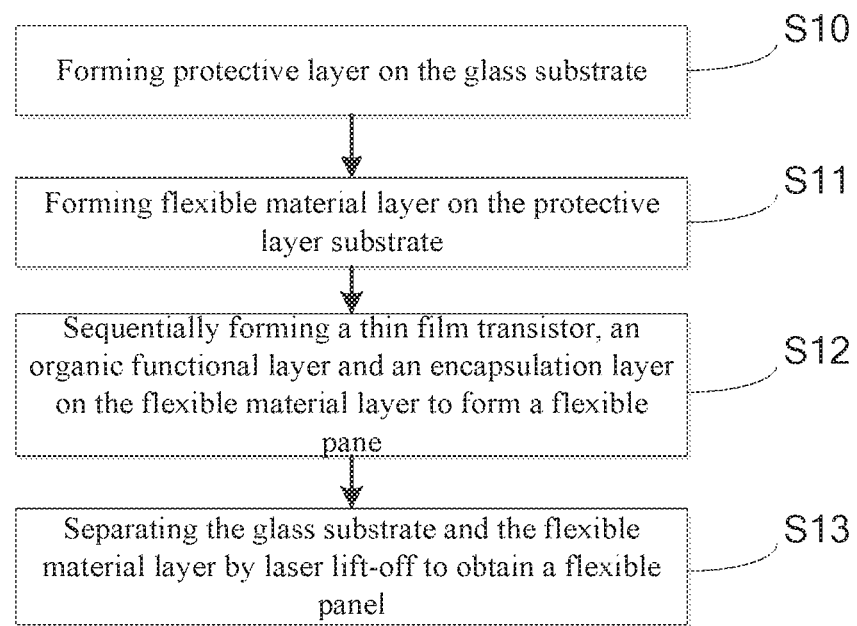
Figure 2:
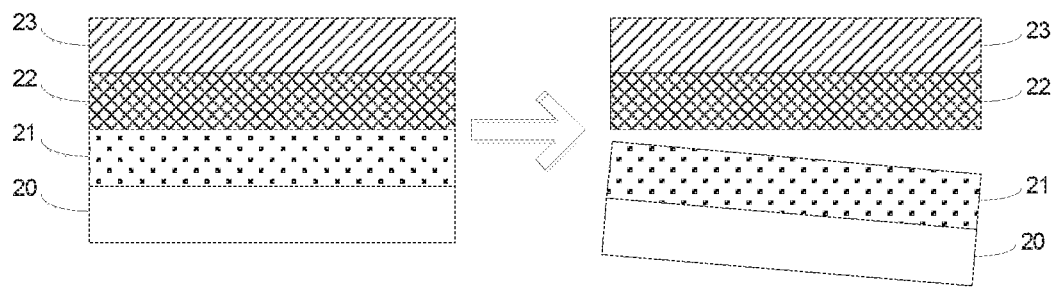

Referring to FIG. 1, FIG. 1 is a schematic flow chart of a first embodiment of a flexible panel fabricating method that the present invention based on; with reference to FIG. 2, the flexible panel fabricating method includes:

S10: A protective layer is formed on a glass substrate.

The protective layer 21 is formed on the glass substrate 20. The panel of the flexible display device must be a flexible substrate. Since the flexible substrate is easily deformed, during the fabricating of the display substrate, it is necessary to form a flexible material layer on the glass substrate and then sequentially form various displays structure on the flexible material layer. So, after the initial cleaning of the glass substrate, can proceed a layer of photo organic photoresist coating, such as DL-1001-C, or other coating may be applied to form a temporary buffer layer on the glass substrate to protect the flexible substrate from affecting by the glass substrate.

S11: A flexible material layer is formed on the protective layer.

A layer of flexible material 22 is formed on the protective layer 21. Specifically, coating, the polyimide on the protective layer 21, drying and curing to form the flexible material layer 22 that is a flexible substrate. The protective layer on the flexible material layer can effectively block the influence of large particles on the glass substrate, reduce the problem of protrusion and depression of the flexible substrate, and further promote the success rate of the flexible substrate coating. Among them, polyimide is one of the best overall performance synthetic organic polymers, making the flexible materials on the protective layer with good optical, chemical resistance and water and oxygen barrier properties.

S12: sequentially forming a thin film transistor, an organic functional layer and an encapsulating layer on a flexible material layer to form a flexible panel.

A thin film transistor 23, an organic functional layer, and an encapsulating layer (not shown) are sequentially formed on the flexible material layer 22 to form a flexible panel. Specifically, a series of operations such as thin film transistors, data lines, gate lines, capacitors, anodes, cathodes, organic light emitting layers, pixel defining layers and the like (not shown) are sequentially formed on the flexible material layer.

S13: The glass substrate and the flexible material layer are separated by laser lift-off to obtain a flexible panel.

By the laser lift-off method to make glass substrate 20 separated from the flexible material. Specifically, use the LLO laser lift-off technique to separate the glass substrate 20 and the protective layer 21 from the flexible material layer 22. This embodiment can use LLO laser lift-off technique to proceed peeled off between the glass substrate and the protective layer in advance, and then use LLO laser lift-off technique again to proceed peel off between the protective layer and the flexible material layer, finally achieve the effect of separation between the glass substrate and the flexible materials.

By the above method, a protective layer is added between the glass substrate and the flexible material layer so that the particulate matter on the glass substrate does not directly affect the flexible material layer, so as to obtain the complete flexible panel when the glass substrate and the flexible material layer are peeled off, to reduce the rate of defective stripping of the flexible material while promote the optical characteristics of the flexible display.

Figure 3:
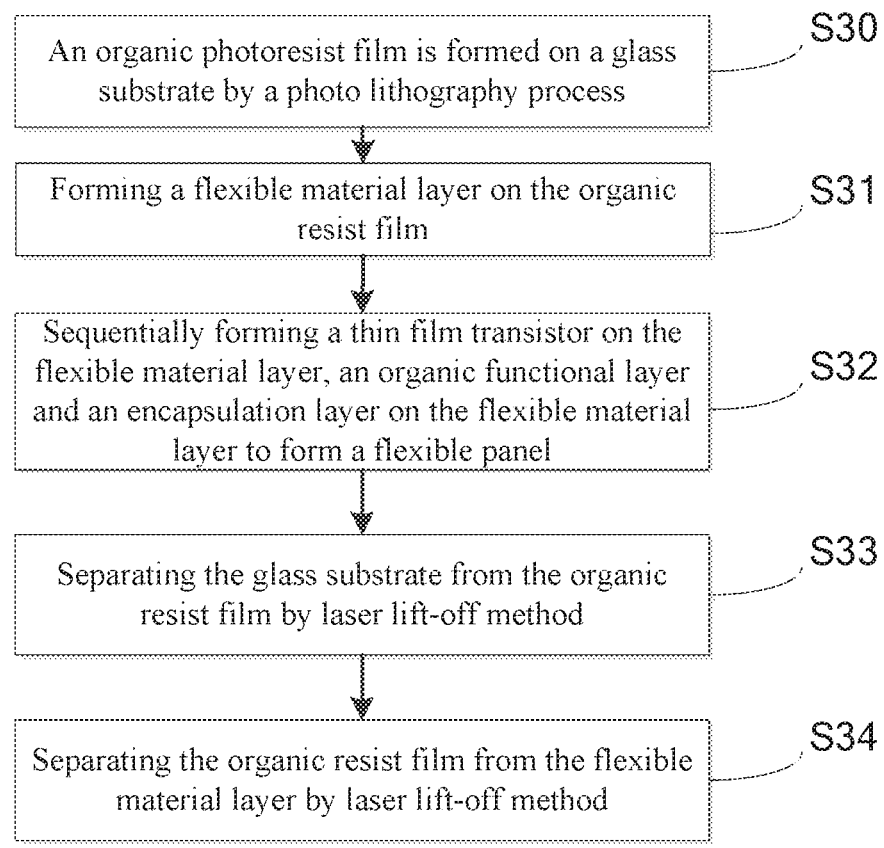
Figure 4:
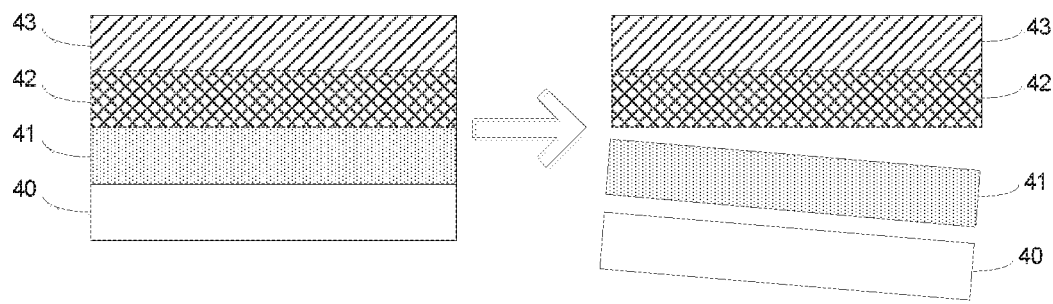

Please refer to FIG. 3. FIG. 3 is a schematic flow chart the present invention based on a second embodiment of the flexible panel fabricating method. Referring to FIG. 4, a flexible panel fabricating method includes:

S30: An organic photoresist film is formed on a glass substrate by a photo lithography process.

The organic photoresist film 41 is formed on the glass substrate 40 by a photo lithography process. Specifically, use photo lithography technology to coat a layer of organic photoresist on the glass substrate. The technology used by photo is lithography technology, the used materials is a photosensitive material, which called a photo resist (PR). Lithography technology transfers the pattern on the mask to the PR in advance, and then dissolves or retains the irradiated PR part by the solvent, so as to form a photoresist pattern that is exactly the same as or is complementary to the mask, and proceed curing, and finally form a layer of organic photoresist film.

Optionally, the organic resist film has a thickness of 1.5 µm to 2 µm.

S31: forming a flexible material layer on the organic resist film.

A flexible material layer 42 is formed on the organic resist film 41. Specifically, the polyimide film 41 is coated, dried and cured on the organic photoresist film 41 to form the flexible material layer 42 which is the flexible substrate. The organic resist film can effectively block the influence of large particles on the glass substrate, reduce the problem of protrusion and depression of the flexible substrate, and further promote the success rate of the flexible substrate coating.

S32: sequentially forming a thin film transistor on the flexible material layer, an organic functional layer and an encapsulating layer on the flexible material layer to form a flexible panel.

A thin film transistor 43, an organic functional layer, and an encapsulating layer (not shown) are sequentially formed on the flexible material layer 42 to form a flexible panel.

Specifically, a thin film transistor 43, a data line, a gate line, a capacitor, an anode, a cathode, an organic light emitting layer, a pixel defining layer and the like (not shown) are sequentially formed on the flexible material layer 42, and proceed evaporation, packaging and a series of operations.

S33: Through laser lift-off method to separate the glass substrate from the organic resist film.

The glass substrate 40 is separated from the organic resist film 41 by the laser lift-off method.

S34: Through laser lift-off method to separate the organic resist film from the flexible material layer.

The organic resist film 41 is separated from the flexible material layer 42 by laser lift-off method. A more complete flexible substrate is obtained by the two LLO laser lift-off techniques, and the planarization of the flexible substrate is optimized to facilitate the flexible display optical characteristics.

By the above method, through coat organic photoresist film layer on the glass layer, temporarily has a buffer effect, to protect the flexible substrate, so that the particulate matter on the glass layer does not affect the flexible material layer, and effectively prevent the flexible substrate due to particulate matter caused by the bump and depression and other bad problems.

Figure 5:
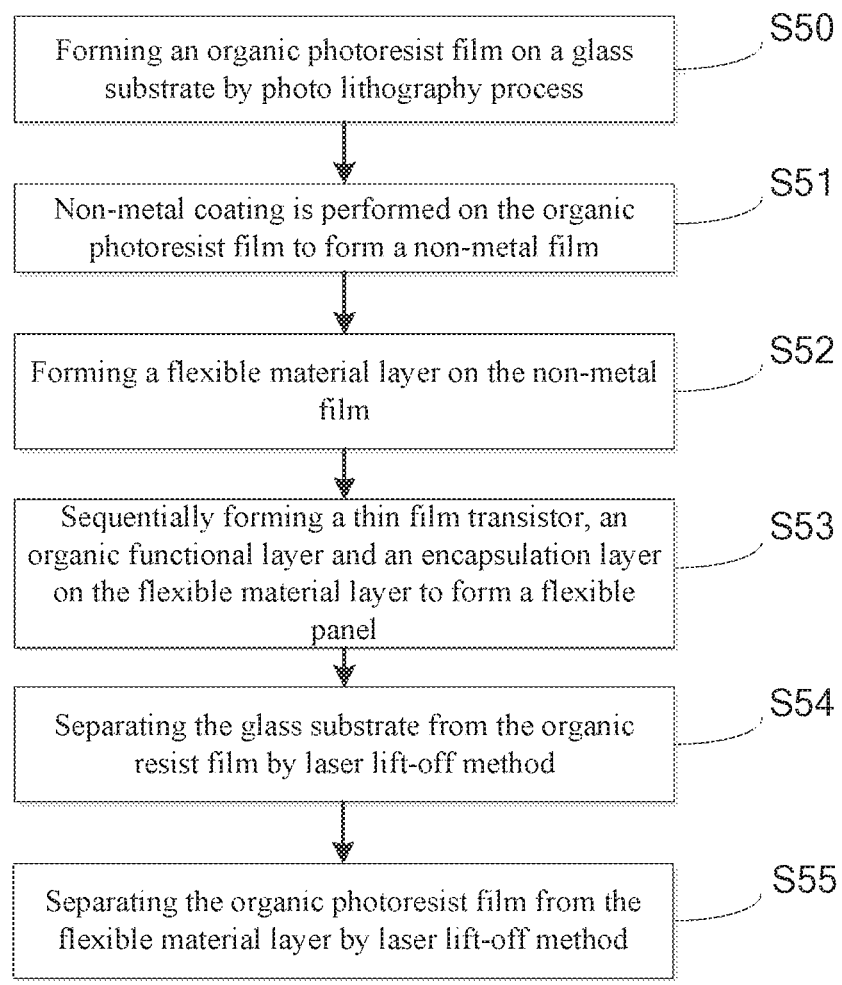

Referring to FIG. 5, FIG. 5 is a schematic flow chart of a third embodiment of the present invention based on a flexible panel fabricating method. Flexible panel fabricating methods include:

S50: forming an organic photoresist film on a glass substrate by photo lithography process;

S51: Non-metal coating is performed on the organic resist film to form a non-metal film.

S52: forming a flexible material layer on the non-metal film.

S53: sequentially forming a thin film transistor, an organic functional layer and an encapsulating layer on the flexible material layer to form a flexible panel.

S54: Through laser lift-off method to separate the glass substrate from the organic resist film.

S55: separating the organic resist film from the flexible material layer by the laser lift-off method.

Figure 6:
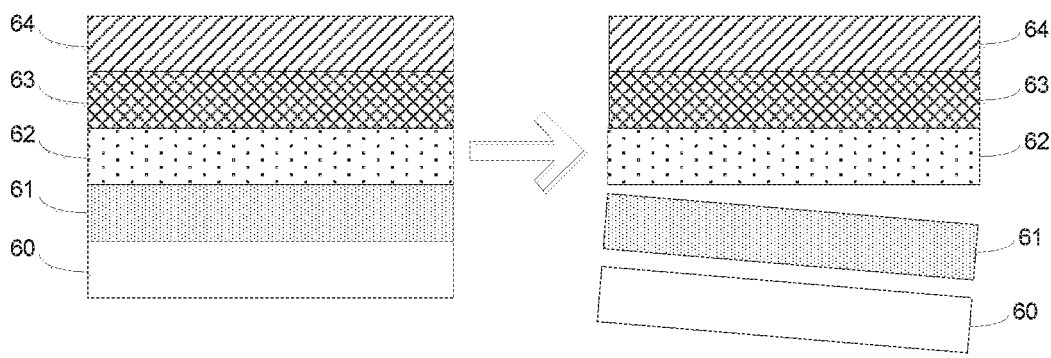

As shown in FIG. 6, specifically, the organic photoresist film 61 is formed on the glass substrate 60 by the photo lithography process; and the non-metal coating film is formed on the organic photoresist film 61 to form the non-metal film 62, on the non-metal film 62 a flexible material layer 63 is formed on which a thin film transistor 64 and a data line, a gate line, a capacitor, an anode, a cathode, an organic light emitting layer, a pixel defining layer and the like (not shown) are sequentially formed on the flexible material layer 63, and proceed evaporation, packaging and a series of operations. The glass substrate 60 is separated from the organic resist film 61 by laser lift-off, and the organic resist film 61 is separated from the flexible material layer 63 by the laser lift-off method to finally achieve the effect of separating the glass substrate from the flexible material layer and to form a flexible panel.

Optionally, the thickness of the non-metallic film is 1 µm.

Optionally, the non-metal film is silicon nitride and or silicon oxide.

In the present embodiment, the purpose of block water vapor and oxygen can be reached by coating a non-metal film layer between the organic photoresist layer and the flexible material layer, and at the same time, which facilitates the second LLO laser lift-off of the organic photoresist film and the flexible material layer. Among them, plasma enhanced chemical vapor deposition (PECVD) may be used, with the help of microwaves or radio frequency and so on to ionize the gas containing the film constituent atoms, to form plasma locally, and the plasma chemical activity is strong, it is easy to react and deposit the desired film on the substrate.

Figure 7:
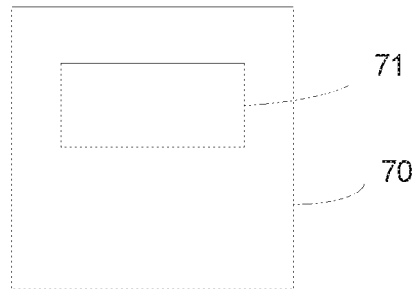
FIG. 7 is a schematic structural view of an embodiment of a flexible display device according to the present invention.

Referring to FIG. 7, the present invention further includes a flexible display device 70. In a specific implement method, the flexible display device 70 includes a flexible panel 71 prepared by any of the above methods. Specific methods are as described in the above embodiments, which will not be repeated here. Furthermore, the flexible display device is an active-matrix organic light emitting diode (AMOLED) or a flexible display. Wherein the flexible panel of the present embodiment, by forming a protective layer on the glass substrate, forming a flexible material layer on the protective layer, sequentially forming a thin film transistor, an organic functional layer and an encapsulating layer on the flexible material layer to form a flexible panel; through the laser lift-off method separates the glass substrate from the flexible material layer to obtain a flexible panel. The protective layer effectively blocks the influence of large particles on the glass substrate, reduces the problems of protrusions and depressions of the flexible substrate, and promote the optical characteristics of the flexible display device.

The above is only the embodiments of the present invention, and does not intend to limit the scope of the present invention. All equivalent structures or equivalent processes using the description of the present invention and the accompanying drawings are directly or indirectly used in other related technologies are all included in the scope of the patent protection of the present invention.

What is claimed is:

1. A fabricating method of a flexible panel, wherein the method comprises:
   forming a protective layer on a glass substrate;
   forming a flexible material layer on the protective layer;
   sequentially forming a thin film transistor, an organic functional layer and an encapsulating layer on the flexible material layer to form the flexible panel;
   separating the glass substrate from the flexible material layer by laser lift-off to obtain the flexible panel;
   wherein forming the protective layer on the glass substrate further comprises:
   forming an organic photoresist film on the glass substrate by a photo lithography process; and
   performing a non-metallic plating on the organic photoresist film to form a non-metallic film.

2. The method according to claim 1, wherein separating the glass substrate from the flexible material layer by laser lift-off comprises:
   separating the glass substrate from the organic photoresist film by laser lift-off; and
   separating the organic photoresist film from the flexible material layer by laser lift-off.

3. The method according to claim 1, wherein forming the flexible material layer on the protective layer specifically comprises:
   coating, drying and curing polyimide on the protective layer to form a flexible material layer.

4. The method according to claim 2, wherein a thickness of the organic photoresist film is 1.5 µm to 2 µm.

5. The method according to claim 2, wherein a thickness of the non-metallic film is 1 µm.

6. The method according to claim 2, wherein the non-metallic film is silicon nitride and/or silicon oxide.

7. A fabricating method of a flexible panel, comprising:
   forming a protective layer on a glass substrate;
   forming a flexible material layer on the protective layer;
   sequentially forming a thin film transistor, an organic functional layer and an encapsulating layer on the flexible material layer to form the flexible panel; and
   separating the glass substrate from the flexible material layer by laser lift-off to obtain the flexible panel;
   wherein forming the protective layer on the glass substrate comprises:
   forming an organic photoresist film on the glass substrate by a photo lithography process; and
   performing a non-metallic plating on the organic photoresist film to form a non-metallic film.

8. The method according to claim 7, wherein separating the glass substrate from the flexible material layer by laser lift-off further comprises:
   separating the glass substrate from the organic photoresist film by laser lift-off; and
   separating the organic photoresist film from the flexible material layer by laser lift-off.

9. The method according to claim 7, wherein forming the flexible material layer on the protective layer specifically comprises:
   coating, drying and curing polyimide on the protective layer to form a flexible material layer.

10. The method according to claim 8, wherein a thickness of the non-metallic film is 1 µm.

11. The method according to claim 8, wherein the non-metallic film is silicon nitride and/or silicon oxide.

* * * * *